March 31, 1964 W. C. WOODS 3,126,609

METHOD OF FABRICATING ELECTRONIC COMPONENTS

Filed Sept. 7, 1960

INVENTOR.
WILLIAM C. WOODS

BY David M. Keay

AGENT.

United States Patent Office 3,126,609 Patented Mar. 31, 1964

3,126,609
METHOD OF FABRICATING ELECTRONIC COMPONENTS

William C. Woods, Lynn, Mass., assignor to Sylvania Electric Products Inc., a corporation of Delaware Filed Sept. 7, 1960, Ser. No. 54,489
4 Claims. (Cl. 29—25.3)

Figures 1, 2, 3, 4, 5:
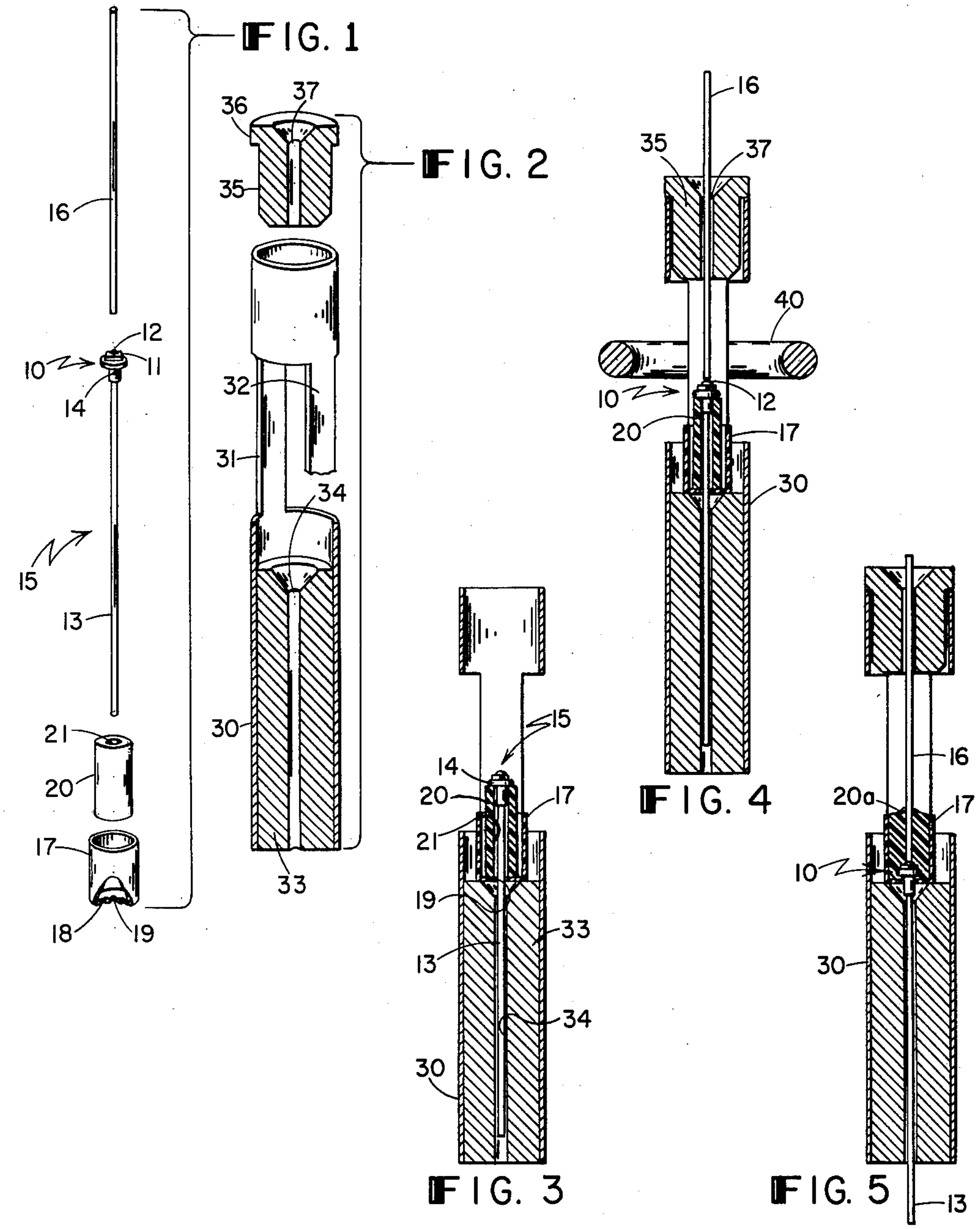

This invention relates to electronic components, and more particularly, to methods of fabricating axial lead semiconductor electrical translating devices.

Semiconductor devices of various well known types such as transistors and diodes have come into widespread use during the past few years. Semiconductor diodes of both the point contact and junction types are finding countless uses in many applications, some of which require large quantities of relatively inexpensive devices. In order to provide semiconductor diodes in quantity and at relatively low cost various forms of simple, inexpensive enclosures have been developed for housing the electrically active elements of devices which are used in certain applications. One type of enclosure for axial lead junction diodes is a generally cylindrically shaped quantity of a plastic material. The electrically active elements are embedded in the plastic material and the two leads extend outward in opposite directions from the encapsulated active elements.

In the fabrication of semiconductor diodes having the type of enclosure described above, the active elements are first produced by any of various known techniques for the formation of a junction in a body of semiconductor material, depending upon the electrical characteristics desired. The semiconductor body is then securely mounted on the end of a first lead. A second lead is attached electrically and mechanically to the active elements on the opposite side of the junction in the semiconductor body. A generally cylindrical hollow shell of a cured plastic material having one open and a wall across the other end with an opening at its center and a pellet of an uncured plastic material having a bore through its length are provided to form the encapsulating enclosure for the active elements. The pellet and the shell are threaded on one of the leads with the shell encircling the pellet. The pellet is melted to fill the interior of the shell and surround the active elements which are advanced into the shell. The material of the pellet is then cured or solidified to provide the complete encapsulated diode. Maintaining proper axial alignment between the two leads from the time the second lead is attached until the pellet material has been cured may be difficult because of the absence of a mechanical connection between the second lead and the active elements which is strong enough to provide rigid support for the lead. This problem is particularly significant with certain types of devices including alloyed junction diodes in which the lead is attached to a small alloyed electrode of conductivity type imparting material. During the encapsulating step, the parts may be held in a fixture in order to provide and maintain proper alignment. However, the connection may become weakened, or broken, or stresses on the active elements may damage them electrically as a result of the handling of a device which takes place after the lead is attached and before the encapsulating material can be cured and thus supply mechanical support for the leads.

It is an object of the present invention, therefore, to provide an improved method for fabricating axial lead components.

It is a more specific object of the invention to provide an improved method for assembling the parts of an axial lead semiconductor diode with the active elements encapsulated in solid plastic material.

Briefly, in accordance with the objects of the invention an assembly of active elements including an electrode are supported on a fusible, heat curable plastic preform which is contained in a generally cup-shaped shell. The active elements are located on the preform so that the electrode is on a face of the assembly removed from the face adjacent the preform. A lead or contact member is then positioned with one extremity against and supported by the electrode. Heat is applied to the region of contact between the lead and the electrode to form a mechanical bond between them. Subsequently, the preform is heated to cause it to melt and permit the assembly of active elements to be embedded in the material of the preform. Heating is continued until the material of the preform cures and hardens.

Additional objects, features, and advantages of the method of the invention will be apparent from the following detailed description and the accompanying drawings wherein:

FIG. 1 is a perspective view of parts of an alloyed junction semiconductor diode which are to be assembled to form an axial lead plastic encapsulated semiconductor diode according to the method of the invention, FIG. 2 is a perspective view in cross section of a two-part fixture employed in carrying out the fabrication of a semiconductor diode according to the method of the invention, FIG. 3 is a view in cross section of a section of the fixture of FIG. 2 with parts of the device as shown in FIG. 1 supported therein at one stage during the process of assembling the semiconductor diode, FIG. 4 is a similar view showing both sections of the fixture with all the parts of the diode positioned therein in preparation for assembly, and FIG. 5 is a view in cross section showing the fixture with the assembled semiconductor diode upon completion of assembly according to the method of the invention.

In fabricating an alloyed junction diode according to the method of the invention, the electrically active elements 10 which include a die 11 of semiconductor material with an electrode 12 of a conductivity type imparting impurity alloyed to the die are attached to a lead 13 by means of a supporting base 14 to form a subassembly 15 as shown in FIG. 1. A second lead 16 for making contact to the electrode is also provided. A hollow outer case or shell 17 for enclosing the active elements is of a cured epoxy resin. It is generally cylindrical in shape and is open at one end. There is a wall 18 across the other end of the shell making it generally cup-shaped, and there is a small opening 19 in the center of the wall which is large enough to accommodate the lead 13 of the subassembly. The material in which the active elements are to be embedded is in the form of a preform or pellet 20 of an uncured thermosetting epoxy resin which can be liquefied and then cured by the application of heat at a relatively low temperature which is not harmful to the active elements. The pellet is generally cylindrical in shape and of smaller diameter than the inside diameter of the shell. A bore 21 along the axis of the pellet is of sufficient diameter to accommodate the subassembly lead 13 without permitting the active elements to pass through.

FIG. 2 shows a two-part fixture which is employed to hold and align the parts during the assembly operation. The main or base section 30 is primarily a cylindrical tube having portions of its walls removed for purposes which will be explained more fully below. This conformation of the tube thus affords supports 31 and 32 with openings between them. An insert 33 is mounted in the lowermost portion of the fixture below the supports. A bore 34 passes through the insert along its axis. The other part of the fixture consists of a cylindrical plug 35 adapted to fit closely in the uppermost portion of the base section of the fixture. A flange or rim 36 supports the plug on the top edge of the fixture. An opening or bore 37 extends axially through the plug.

In carrying out the method of the invention for assembling the parts as shown in FIG. 1 in conjunction with the fixture as shown in FIG. 2, the shell 17 is first placed in position in the base section of the fixture as shown in FIG. 3 with the open end upward. The shell is supported by the insert 33 and its lateral movement is restricted sufficiently by the walls of the fixture to prevent substantial misalignment of the opening in the bottom of the shell with the bore 34 in the fixture. Next, the preformed pellet or bead 20 of uncured resin is placed in the shell. The subassembly 15 is then placed in position in the fixture. The base member 14 contacts the bead and thus the subassembly is supported thereby with the lead 13 extending through the bore 21 in the bead, through the opening 19 in the shell, and into the bore 34 in the insert. Alternatively, the encapsulating parts and the subassembly may be positioned in the fixture by first threading the bead 20 and then the shell 17 on the subassembly lead 13, and then placing the parts in the fixture as shown in FIG. 3. Next, the plug 35 is placed in position in the top portion of the main section of the fixture as shown in FIG. 4. The second lead 16 is then placed in the fixture as shown extending through the bore 37 in the plug. The end of the lead is supported directly on the electrode 12 of the active elements. The plug serves to laterally align the lead properly but provides no vertical support for it.

As can be seen in FIG. 4 the parts are located in the fixture with the active elements 10 slightly above the solid wall portion of the fixture in the region of the openings. An RF induction heating coil 40 at least partially encircles the fixture and a portion of the second lead 16. Electrical energy is applied to the coil and the lead becomes heated in the portion encircled by the coil. The openings in the fixture permit coupling of the RF energy to the lead. As the heat spreads to the end of the lead it melts the portion of the electrode 12 with which it is in contact and the electrode material wets the lead. The lead may have a tin coating in which case the tin in the region of contact between the lead and electrode melts to establish a bond between the lead and the electrode. In any event, the semiconductor die is subjected to a minimum of heat so that neither its structure nor the junction formed by the alloyed electrode with the die of semiconductor material are adversely affected.

After the second lead 16 has been fused to the electrode 12, the bead 20 is heated in order to melt and then cure the material of the bead. This operation is accomplished by placing the fixture and its contents in an oven maintained at a temperature sufficiently high to melt and cure the epoxy resin of the bead. In order to insure that the active elements are completely submerged in the molten material of the bead, slight pressure may be applied to the second lead urging it downward, as by the use of a weight resting on the lead.

The completed device after the resin of the bead has been cured is shown in place in the fixture in FIG. 5. The bead material is now in the form of a curved, solid mass **20*a* filling the shell 17 and surrounding the active elements 10 and holding them together with the leads firmly in the shell. A completed axial lead diode enclosed in encapsulating material is thus obtained. The diode may be removed from the fixture by pushing upward on the first lead 13** which extends below the bottom of the fixture as shown in FIG. 5. By the use of this method of assembly the attaching of the lead to the electrode and the encapsulating of the active elements to form a rigid solid enclosure is accomplished without need for manual dexterity, following a single loading operation. Thus handling the assembled active elements and leads while they are in an unsupported fragile condition of partial assembly before the solid encapsulating material provides mechanical strength to the connections is made unnecessary.

A typical device fabricated according to the method of the invention includes a flat die 11 of N-type germanium approximately 80 mils square and 20 mils thick. A spherical dot or pellet of indium 27 mils in diameter is alloyed at the center of one major surface to form a rectifying junction in the die and provide the electrode 12 extending above the surface. A stainless steel base member 14 is soldered to the other major surface of the die by means of a solder plated Kovar disc, and the base member is firmly attached to the end of a lead 13 of tinned copper wire 32 mils in diameter and 1⅜ inches long. The second lead 16 is tinned Dumet wire, and is 20 mils in diameter and 1³⁄₁₆ inches long. The rigid shell or case 17 is molded from an epoxy molding resin sold as #1202 by Epoxy Products, Inc., of Irvington, New Jersey. The shell is approximately .200 inch in diameter and .250 inch in length, and the inside diameter is about .160 inch. The pellet or bead 20 is approximately .300 inch long and .155 inch in diameter. An uncured thermosetting molding compound sold as #5603B by Epoxy Products, Inc., is used as the material of the bead. In assembling the diode, the parts are first positioned in a fixture of brass as shown in FIG. 4. Electrical energy is applied to the RF induction coil to heat the second lead and cause the tin plating adjacent the end of the second lead to melt and fuse to the indium electrode. The entire fixture is then placed in an oven at 85° C. for a period of 24 hours in order to melt the material of the bead and then cure it to provide a solid mass of plastic material encapsulating the active elements and supporting the leads. During the heat treatment in the oven a weight is applied to the top of the second lead in order to urge the active elements downward into the shell and embed them in the bead material while it is molten. It will be readily understood that the devices with which this invention is concerned and the apparatus described above are of relatively small dimensions. Therefore, in practical application of the invention a substantial number of loaded fixtures may be arranged in a group within the oven and sufficient pressure to insure adequate downward movement of the active elements of all of the devices into their respective shells may be provided by a single weighting element.

What is claimed is:

1. The method of assembling an axial lead electrical component including a subassembly comprising the active elements of the component and a first lead attached to the active elements, the active elements including an electrode; a second lead for contacting the electrode of the active elements; a shell open at one end and having a wall at the opposite end with an opening therethrough; and a preform of an uncured plastic material having an axial bore therethrough; said method including the steps of positioning the shell in a holder adapted to receive the shell with the one open end of the shell upward and the wall downward, positioning the preform in the shell with the preform supported by said wall, positioning the subassembly on the preform with the first lead extending downward through the bore in the preform and the opening in the wall of the shell and with the active elements supported by the preform, positioning the second lead in axial alignment with the first lead with the lowermost end thereof in contact with and supported by the electrode of the active elements, applying heat in the region of contact of the second lead and the electrode to fuse the lead to the electrode, melting the preform to permit the active elements to be advanced into the shell and to be embedded in the material of the preform, and subsequently curing the material of the preform.

2. The method of assembling an axial lead semiconductor alloy junction diode including the steps of providing a subassembly comprising a semiconductor die, an electrode of conductivity type imparting material alloyed to one surface of the die, and a first lead attached to the opposite surface of the die; providing a second lead for making contact to the electrode; providing a hollow cylindrical shell of an insulating material having a wall across one end with an opening in the center of the wall; providing a cylindrical bead of an uncured, liquefiable, thermosetting resin having an axial bore therethrough; positioning the subassembly, bead, and shell with the bead inside the shell and supported by said wall, with the first lead extending downward through the bore in the bead and the opening in the wall of the shell, and with the subassembly supported by the bead; positioning the second lead in axial alignment with the first lead with the lowermost end thereof in contact with and supported by said electrode; heating the second lead to cause the lead and the electrode to fuse together; and heating the bead to melt the bead and cause the die and electrode to be embedded in the material of the bead and subsequently to cure the material of the bead to form a solid mass.

3. The method of assembling an axial lead semiconductor alloy junction diode including a subassembly comprising a semiconductor die, an electrode of conductivity type imparting material alloyed to one surface of the die, and a first lead attached to the opposite surface of the die; a second lead for making contact to the electrode; a hollow cylindrical shell of an insulating material having one open end and a wall across the other end with an opening in the center thereof; and a cylindrical bead of an uncured, liquefiable, thermosetting resin having an axial bore therethrough; said method including the steps of placing the shell in a fixture adapted to receive the shell with the one open end of the shell upward and the wall downward, placing the bead in the shell with the bead supported on said wall, placing the subassembly on the bead with the first lead extending downward through the bore in the bead and the opening in the wall of the shell and with the subassembly supported by the bead, the first lead extending downward through an opening in said fixture adapted to receive the first lead, placing the second lead in axial alignment with the first lead with the lowermost end thereof in contact with and supported by said electrode, heating the second lead to cause the lead and the electrode to fuse together, and heating the bead to melt the bead and cause the die and electrode to be embedded in the material of the bead and subsequently to cure the material of the bead to form a solid mass.

4. The method of assembling an axial lead semiconductor alloy junction diode including the steps of providing a subassembly comprising a semiconductor die, an electrode of conductivity type imparting material alloyed to one surface of the die, and a first lead attached to the opposite surface of the die; providing a second lead for making contact to the electrode; providing a hollow cylindrical shell of an insulating material having one open end and a wall across the other end with an opening in the center of the wall; providing a cylindrical bead of an uncured, liquefiable, thermosetting resin having an axial bore therethrough; positioning the subassembly, bead, and shell in a fixture adapted to receive and support the shell and limit lateral movement thereof with the bead inside the shell and supported by said wall, with the first lead extending downward through the bore in the bead and the opening in the wall of the shell, and with the subassembly supported by the bead, the first lead extending downward through an opening in said fixture adapted to receive the lead; positioning the second lead in a portion of the fixture adapted to hold the second lead in axial alignment with the first lead without axially supporting the second lead whereby the lowermost end of the second lead contacts and is supported by the electrode; heating the second lead to cause the lead and the electrode to fuse together; and subsequently heating the fixture and its contents above the melting point of the bead to cause the die and electrode to be embedded in the material of the bead and to cure the material of the bead to form a solid mass.

References Cited in the file of this patent

UNITED STATES PATENTS 2,964,831 Peterson ______________ Dec. 20, 1960